(12) United States Patent
Nam

(10) Patent No.: US 7,618,863 B2
(45) Date of Patent: Nov. 17, 2009

(54) METHOD OF FABRICATING FLASH MEMORY DEVICE WITH INCREASED COUPLING RATIO

(75) Inventor: Sang-Woo Nam, Chungcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/849,673

(22) Filed: Sep. 4, 2007

(65) Prior Publication Data
US 2008/0054344 A1 Mar. 6, 2008

(30) Foreign Application Priority Data
Sep. 4, 2006 (KR) ............... 10-2006-0084538

(51) Int. Cl.
*H01L 29/788* (2006.01)
(52) U.S. Cl. ............... 438/257; 438/264; 257/315; 257/314; 257/E21.422; 257/E29.3
(58) Field of Classification Search ............... 257/321, 257/E29.3, 314, 315, 316, 319, 320, E21.422; 438/261, 257, 264, 265
See application file for complete search history.

(56) References Cited

U.S. PATENT DOCUMENTS

2002/0187609 A1* 12/2002 Kim et al. .......... 438/257
2003/0054608 A1* 3/2003 Tseng et al. ........ 438/257

* cited by examiner

*Primary Examiner*—Matthew Smith
*Assistant Examiner*—Michele Fan
(74) *Attorney, Agent, or Firm*—Sherr & Vaughn, PLLC

(57) ABSTRACT

A method of fabricating a flash memory which increases a coupling ratio between a floating gate and a control gate in a cell. The method comprises sequentially forming a tunnel oxide film, and polysilicon and first insulation films for a floating gate on an active area of a semiconductor substrate; forming a photoresist as a mask on the first insulation film, and performing an etching process using the photoresist as the mask; forming a hard mask by depositing a second insulation film for prevention of oxidation on the semiconductor substrate; forming an STI by using the hard mask; oxidizing sidewalls of the STI and gap-filling the STI; forming a floating gate by removing the second insulation film remaining as the hard mask; and sequentially forming an ONO film and a control gate on the floating gate.

13 Claims, 6 Drawing Sheets

METHOD OF FABRICATING FLASH MEMORY DEVICE WITH INCREASED COUPLING RATIO

This application claims the benefit under 35 U.S.C. § 119 of Korean Patent Application No. 10-2006-0084538, filed Sep. 4, 2006, which is hereby incorporated by reference in its entirety.

BACKGROUND

Generally, flash memory devices are advantageous in that stored data is not lost even when its power supply is stopped. For this reason, flash memory devices are widely used for data storage of a PC BIOS, a set-top box, a printer and a network server. Recently, flash memory devices have also been used in digital cameras and mobile phones.

Among the different types of flash memory devices, an EEPROM (Electrically Erasable Programmable Read-Only Memory) type flash memory device may completely erase data from memory cells, or may erase data from memory cells by each unit sector.

In such an EEPROM type flash memory device, when in a programming mode, a channel hot electron is generated at a drain side, and the channel hot electron is stored in a floating gate, whereby a threshold voltage of the cell transistor increases.

Alternatively, when in an erasing mode of this EEPROM type flash memory device, a high voltage is generated between the floating gate and source/substrate, and the channel hot electron stored in the floating gate is discharged, thereby lowering the threshold voltage of the cell transistor.

The EEPROM type flash memory device may have an ETOX (EPROM Thin Oxide) cell or a split gate type cell. At this time, the ETOX cell is formed as a simple stack structure. In case of the split gate type cell, two transistors are formed in each cell. Specifically, in case of the ETOX cell, one memory cell has the stack structure of a floating gate and a control gate, wherein the floating gate stores charges therein, and the control gate receives a driving power.

Meanwhile, the split gate type cell is comprised of the two transistors, that is, a selection transistor and a cell transistor. Both the selection and cell transistors use one control gate, wherein some of the control gate is overlapped with the floating gate and the other is positioned in parallel to the surface of substrate.

Example FIGS. 1A to 1F are cross section views to illustrate a method of fabricating a self-alignment STI and a floating gate in a flash memory, which illustrate an ETOX cell-structure flash memory.

Figure 1A:
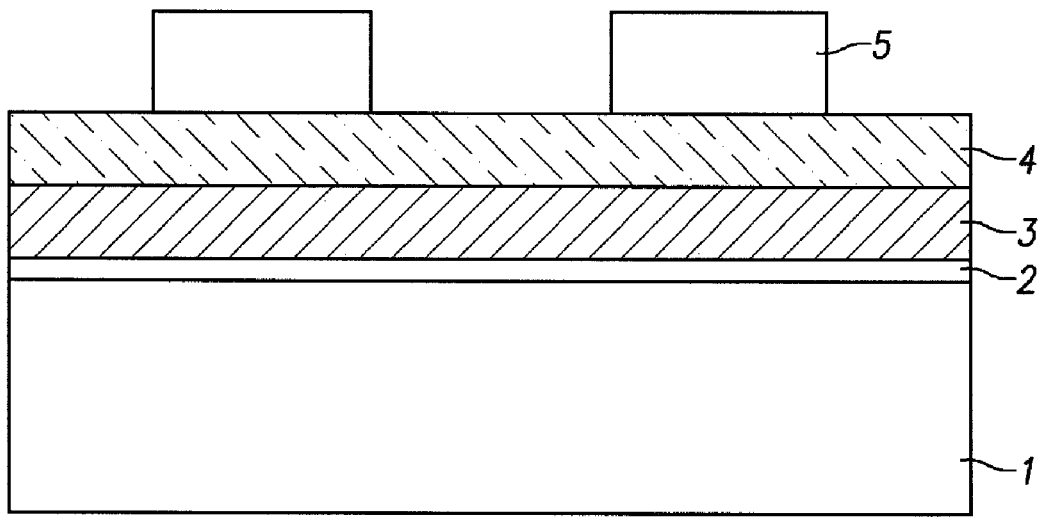

First, as shown in example FIG. 1A, a tunnel oxide film 2 is formed on an active area of a semiconductor substrate 1, and a first polysilicon film 3 for a floating gate is formed on the tunnel oxide film 2. After that, a nitride film (or oxide film) 4 is formed on the first polysilicon film 3, wherein the nitride film 4 functions as a hard mask. Then, a photoresist 5 which serves as a mask is formed on the nitride film 4.

Figure 1B:
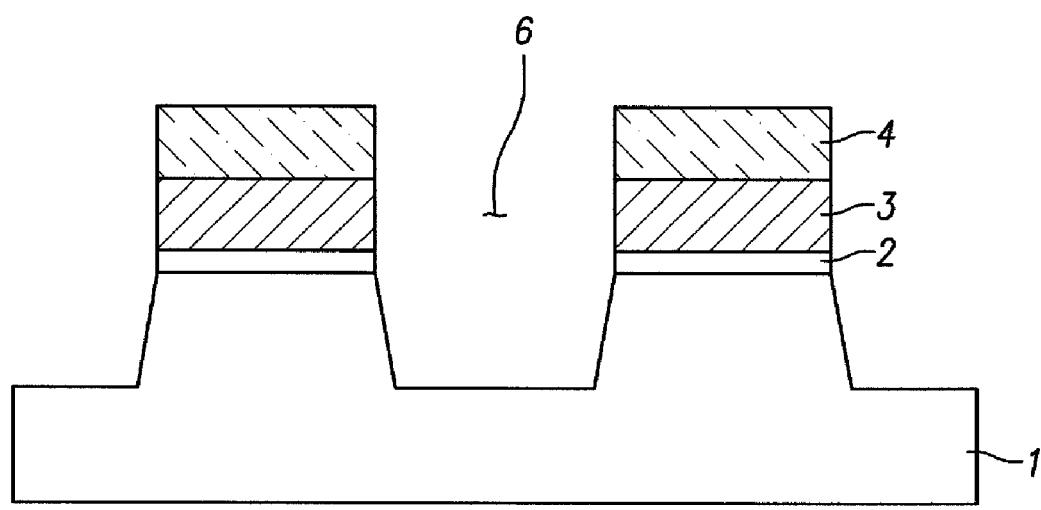

Referring to example FIG. 1B, a STI (Shallow Trench Isolation) 6 is formed by using the photoresist 5 as the mask.

Figure 1C:
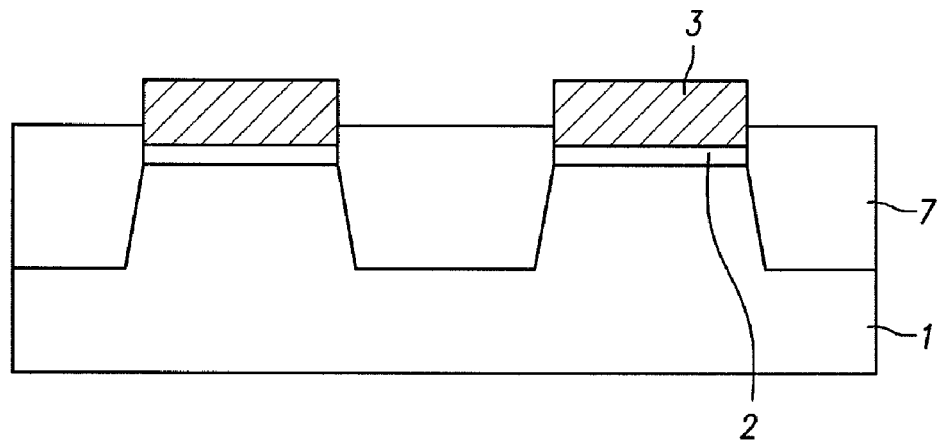

As shown in example FIG. 1C, the STI 6 is gap-filled with an insulation material, thereby forming an insulation film 7. After that, a first floating gate is formed by removing the nitride film 4 of the hard mask.

Figure 1D:
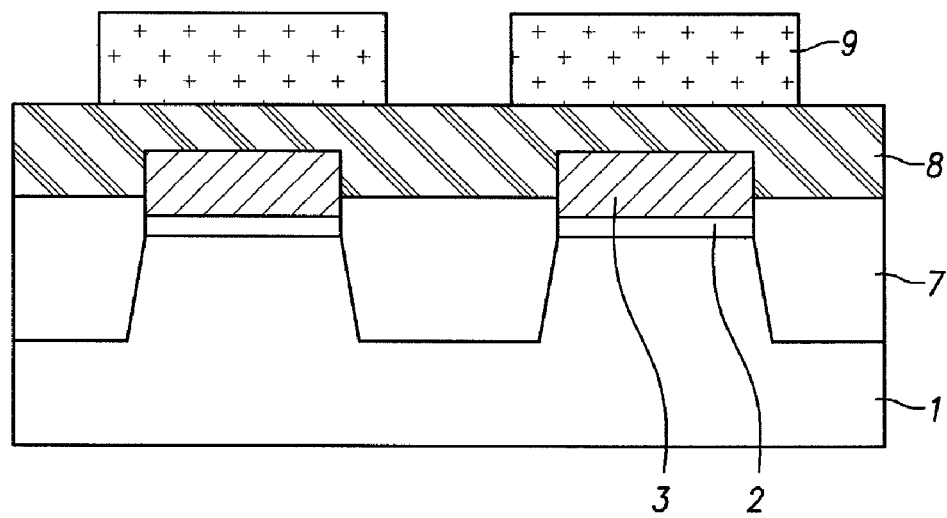

Thereon, a second polysilicon film 8 for a second floating gate is formed as shown in example FIG. 1D, and a photoresist mask 9 is formed on the second polysilicon film 8.

Figure 1E:
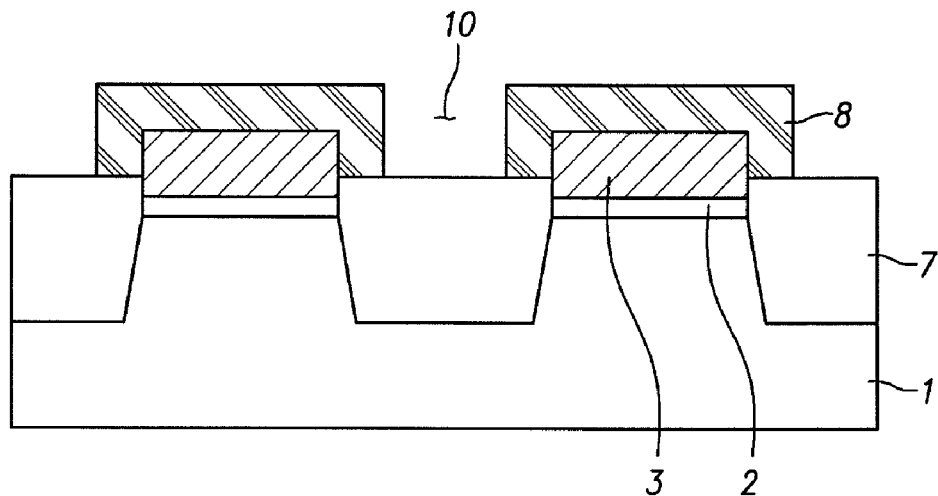

After that, the second polysilicon film 8 is etched by using the photoresist mask 9, to thereby form a second floating gate 10 as shown in example FIG. 1E.

Figure 1F:
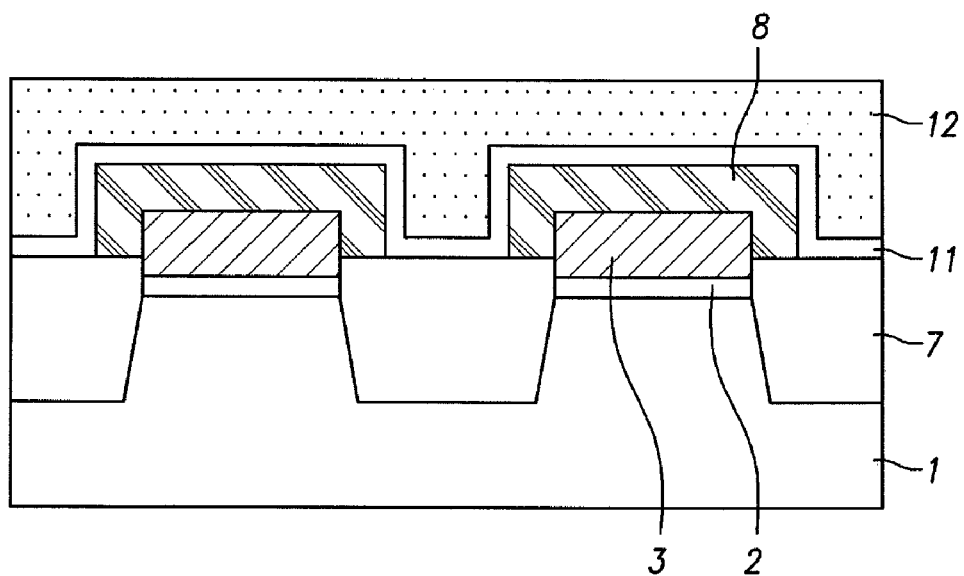

As shown in example FIG. 1F, an ONO film 11 is formed on the second floating gate 10, and a control gate 12 is formed on the ONO film 11. Through these steps, a gate stack is completed.

However, when forming the floating gate of the device having the aforementioned self-alignment STI, it is impossible to realize a large coupling ratio (CR) with the first polysilicon film 3 used when forming the STI. Accordingly, use of the second polysilicon film 8 is required to form the floating gate. That is, there is a requirement for the additional mask to form the floating gate, whereby the fabrication cost and complexity increase. Furthermore, as design sizes are reduced it may be physically impossible to achieve the necessary overlay margins between the films.

SUMMARY

Embodiments relate to a flash memory device that includes a floating gate including a tunnel oxide film and a polysilicon film on an active area of a semiconductor substrate; an STI wherein the sidewalls of the STI are oxidized in an oxide-oxidization method, and then the STI is gap-filled to prevent forming voids therein; and an ONO film and a control gate sequentially formed on the floating gate.

Embodiments relate to a method of fabricating a flash memory device comprising: sequentially forming a tunnel oxide film, a polysilicon film and a first insulation film on an active area of a semiconductor substrate; performing an etching process on the first insulation film; forming a hard mask on the semiconductor substrate; forming an STI by using the hard mask; oxidizing sidewalls of the STI and gap-filling the STI; forming a floating gate by removing the hard mask; and sequentially forming an ONO film and a control gate on the floating gate.

DRAWINGS

Example FIGS. 1A to 1F are cross section views to illustrate a method of forming a self-alignment STI and a floating gate in a flash memory device.

Example FIGS. 2A to 2F are cross section views to illustrate a method of forming a self-alignment STI and a floating gate in a flash memory device according to embodiments described herein.

DESCRIPTION

Hereinafter, a method of fabricating a flash memory device according to the embodiments will be described with reference to the accompanying drawings.

Example FIGS. 2A to 2F are cross section views to illustrate a method of forming a self-alignment STI and a floating gate in a flash memory device according to the embodiments described herein, which illustrate an ETOX cell-structure flash memory device.

Figure 2A:
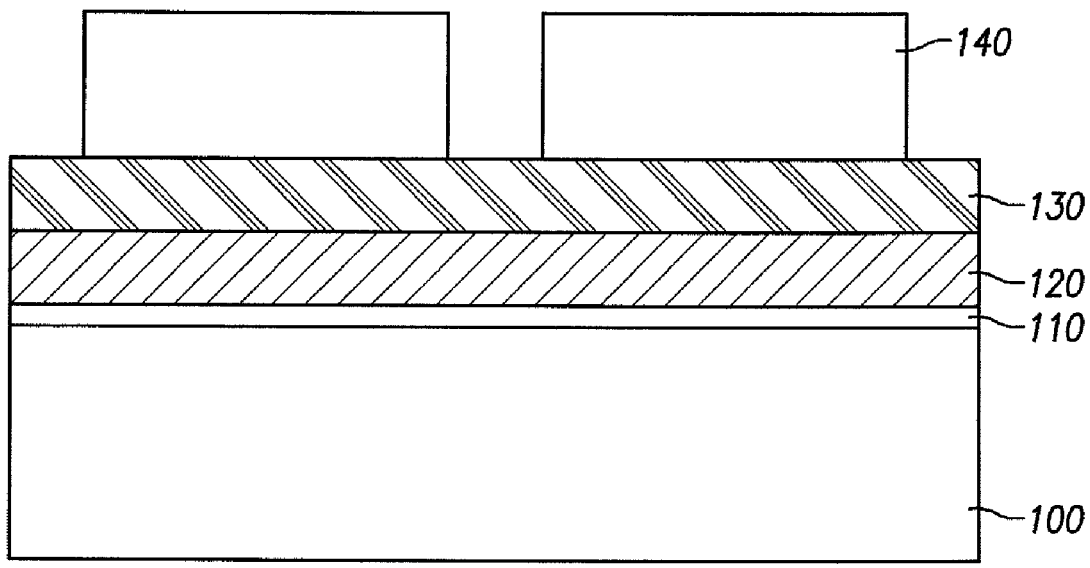

First, as shown in example FIG. 2A, a tunnel oxide film 110 is formed on an active area of a semiconductor substrate 100. Then, a polysilicon film 120 and an insulation film 130 for a floating gate are sequentially formed on the tunnel oxide film 110.

Then, a photoresist 140 which serves as a mask is formed on the insulation film 130, and an etching process is applied thereto.

At this time, the tunnel oxide film 110 may be formed of SiO$_2$, SiON, La$_2$O$_3$, ZrO$_2$ or Al$_2$O$_3$, or may be formed of a stack structure inclusive of at least two of the aforementioned oxides. Also, the tunnel oxide film 110 may be formed at a thickness between approximately 30 Å and approximately 300 Å by growing or deposition.

The polysilicon film 120 is for formation of the floating gate. The polysilicon film 120 is deposited at a thickness between approximately 100 Å and approximately 1500 Å by LPCVD (Low Pressure Chemical Vapor Deposition).

The insulation film 130 may be formed of an oxide film of SiO$_2$ or a nitride film of SiN.

An etching process is applied to the insulation film 130 by using a photoresist pattern, to thereby define source and drain regions. This etching process is performed until the tunnel oxide film 110 on the semiconductor substrate 100 is removed, to thereby expose the semiconductor substrate 100.

At this time, a dopant is implanted into the defined source and drain regions, thereby forming source and drain regions (not shown).

As an additional example, the tunnel oxide film 110 may be exposed by the etching process to the polysilicon film 120, instead of the etching process to the tunnel oxide film 110 using the photoresist pattern.

Figure 2B:
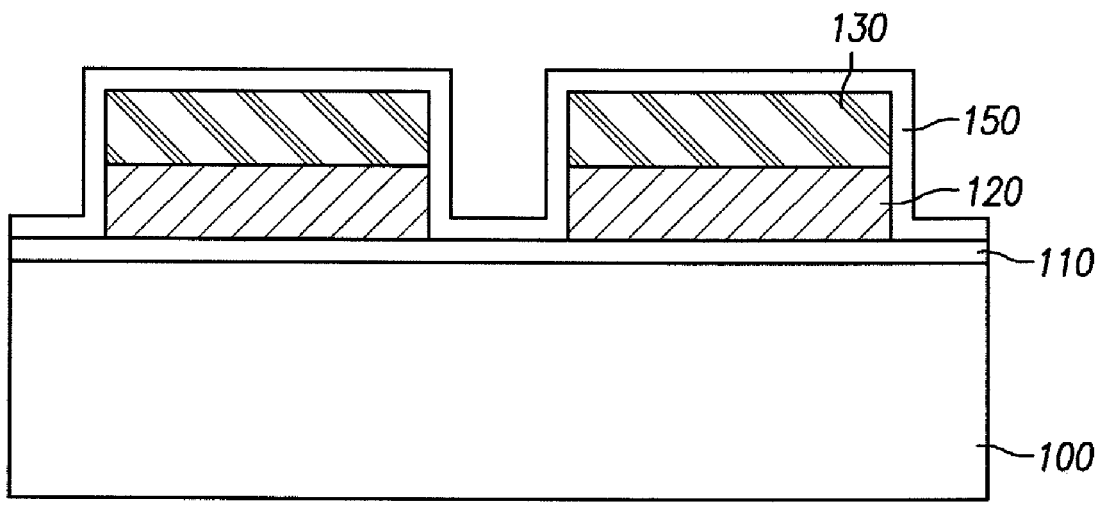
Figure 2C:
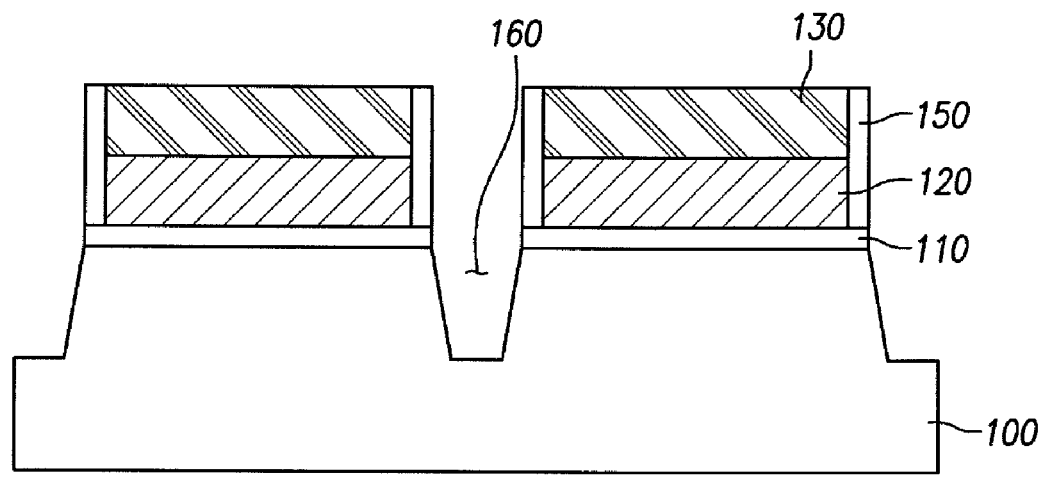

As shown in example FIG. 2B, an oxidizing-prevention insulation film 150 is deposited to prevent the floating gate from being oxidized during the oxidation process for the active area. After that, a hard mask is formed from the oxidizing-prevention insulation film 150; this hard mask is formed with the oxidizing-prevention insulation film 150 remaining at the lateral side of stack structure inclusive of the polysilicon film 120 and the insulation film 130.

The oxidizing-prevention insulation film 150 may be formed of an oxide film of SiO$_2$ or a nitride film of SiN.

After depositing the oxidizing-prevention insulation film 150, the silicon substrate is etched to a predetermined depth by using the hard mask. Through this etching process, an STI 160 is formed as shown in example FIG. 2C.

Figure 2D:
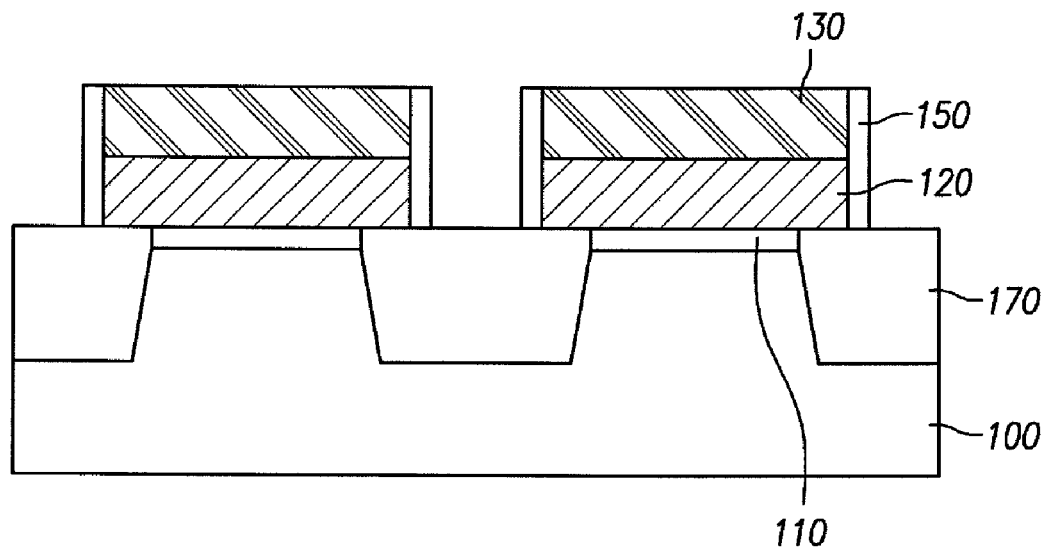

As shown in example FIG. 2D, the sidewalls of STI 160 are oxidized in an oxide-oxidization method. At this same time, the STI 160 is gap-filled, thereby completing an STI mask.

Since the sidewalls of STI 160 are oxidized in the oxide-oxidization method before the gap-filling for the STI, there are no voids.

Figure 2E:
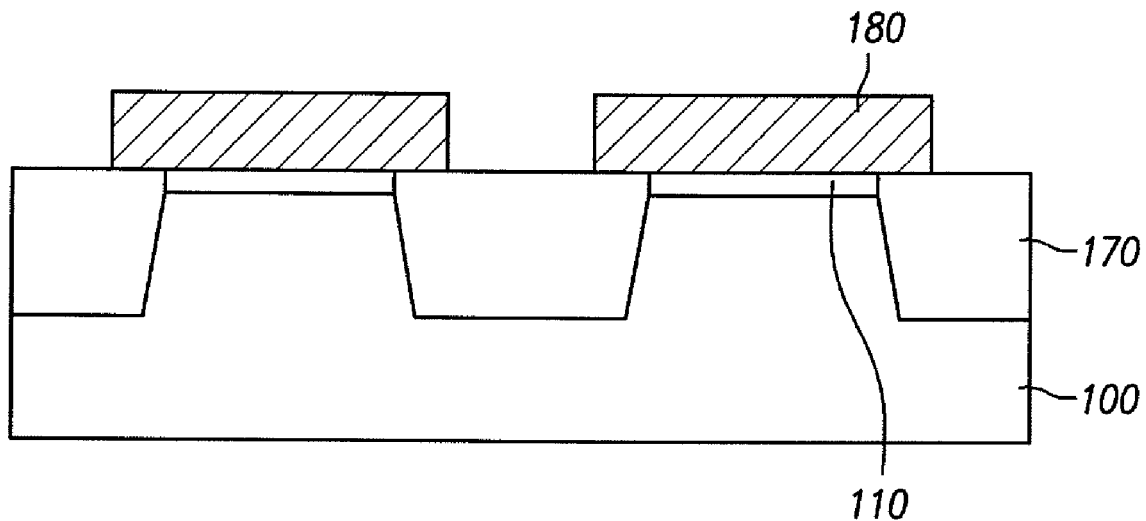

After completing the STI mask, as shown in example FIG. 2E, the insulation film 130 which serves as the hard mask is removed, thereby forming a floating gate 180.

Figure 2F:
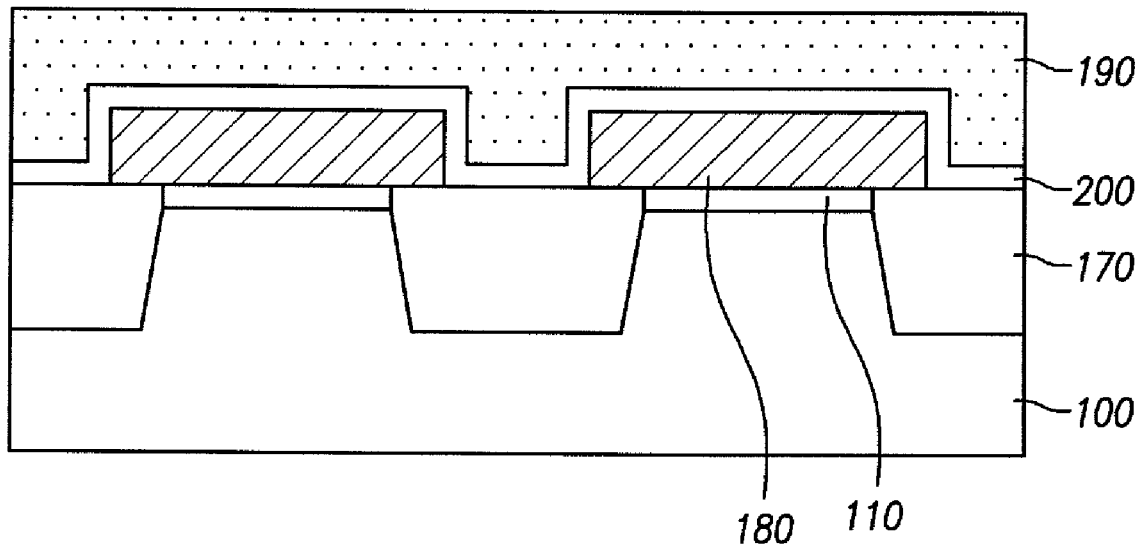

As shown in example FIG. 2F, an ONO film 200 and a control gate 190 are sequentially formed on the floating gate 180. To obtain a coupling ratio between the floating gate 180 and the control gate 190 in a cell, the floating gate 180 is larger than the tunnel oxide film 110 in size. For example, the area of floating gate 180 is maximized as compared with the area of tunnel oxide film 110.

Preferably, the control gate 190 may be formed of at least any one among polysilicon, tungsten (W), silicon germanium (SiGe), silicon germanium carbide (SiGeC), molybdenum (Mo), molybdenum silicide (MoSi2), titanium (Ti), titanium silicide (TiSi2) and titanium nitride (TiN).

The embodiments can prevent misalignment between the floating gate and the tunnel oxide film. Also, the STI and the floating gate can be formed with one mask.

In the embodiments, the floating gate 180 is larger than the tunnel oxide film 110, thereby obtaining the large coupling ratio.

Because the STI gap-filling is realized in the oxide-oxidization method, the forming of voids is prevented. Furthermore, since there is no STI CMP process, the embodiments result in a simplified process.

As mentioned above, the method of fabricating the flash memory device as described has the following advantage: the coupling ratio is increased between the floating gate and the control gate in the ETOX (EPROM Thin Oxide) cell of the flash memory device.

Also, the STI and the floating gate for the flash memory device are formed with one mask by self-alignment. Accordingly, the fabrication cost is decreased owing to the decreased number of masks used, and the re-operation possibility is also lowered. In addition, both problems in relation with an overlay margin and physical limitations resulting from reduced design size can be overcome.

Also, since the oxide film is formed without the gap-filling on formation of the field oxide, it is unnecessary to apply a CMP (Chemical Mechanical Polishing) process as well as the gap-filling on formation of the field oxide, thereby realizing the simplified process.

What is claimed is:

1. A method of fabricating a flash memory device comprising:
   sequentially forming a tunnel oxide film, a polysilicon film and a first insulation film for a floating gate on an active area of a semiconductor substrate;
   forming a photoresist as a mask on the first insulation film;
   performing an etching process using the photoresist as the mask;
   forming a hard mask for prevention of oxidation on the semiconductor substrate;
   forming an STI by using the hard mask;
   oxidizing sidewalls of the STI and gap-filling the STI;
   forming the floating gate by removing the hard mask; and
   sequentially forming an ONO film and control gate on the floating gate, wherein the floating gate is larger than the tunnel oxide film in size of area, to obtain a coupling ratio between the floating gate and the control gate.

2. The method of claim 1, wherein forming the hard mask includes depositing a second insulation film on the semiconductor substrate.

3. The method of claim 2, wherein the second insulation film prevents oxidation.

4. The method of claim 2, wherein removing the hard mask includes removing the second insulation film remaining as the hard mask.

5. The method of claim 2, wherein the first and second insulation films are formed of oxide films of SiO$_2$.

6. The method of claim 2, wherein the first and second insulation films are formed of nitride films of SiN.

7. The method of claim 1, wherein the first insulation film and the polysilicon film are etched by using the photoresist as the mask.

8. The method of claim 1, wherein the tunnel oxide film has a thickness between approximately 30 Å and approximately 300 Å.

9. The method of claim 8, wherein the tunnel oxide film is grown.

10. The method of claim 8, wherein the tunnel oxide film is deposited.

11. The method of claim 1, wherein the sidewalls of the STI are oxidized in an oxide-oxidization method.

12. The method of claim 1, wherein the sidewalls of the STI are oxidized in an oxide-oxidization method, and then the STI is gap-filled to prevent forming voids therein.

13. The method of claim 1, wherein the flash memory device has an ETOX (EPROM Thin Oxide) cell structure.

* * * * *